(12) United States Patent
Jun et al.

(10) Patent No.: US 10,700,144 B2
(45) Date of Patent: Jun. 30, 2020

(54) ORGANIC LIGHT EMITTING DISPLAY DEVICE INCLUDING TOUCH SENSOR

(71) Applicant: LG Display Co., Ltd., Seoul (KR)

(72) Inventors: Chang-Hwa Jun, Paju-si (KR); Jang Jo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/215,241

(22) Filed: Dec. 10, 2018

(65) Prior Publication Data

US 2019/0198574 A1 Jun. 27, 2019

(30) Foreign Application Priority Data

Dec. 21, 2017 (KR) .................. 10-2017-0177024

(51) Int. Cl.
  *H01L 27/32* (2006.01)
  *G06F 3/044* (2006.01)
  *G06F 3/041* (2006.01)

(52) U.S. Cl.
  CPC .......... *H01L 27/323* (2013.01); *G06F 3/044* (2013.01); *G06F 3/0412* (2013.01); *H01L 27/322* (2013.01); *H01L 27/3244* (2013.01); *H01L 2251/558* (2013.01)

(58) Field of Classification Search
  None
  See application file for complete search history.

(56) References Cited

U.S. PATENT DOCUMENTS

| 2014/0166998 | A1* | 6/2014 | Lee | H01L 27/3276 257/40 |
| 2016/0041667 | A1* | 2/2016 | Lai | G06F 3/0412 345/173 |
| 2018/0309082 | A1* | 10/2018 | Chu | H01L 51/5203 |

* cited by examiner

*Primary Examiner* — Nicholas J Lee
(74) *Attorney, Agent, or Firm* — Seed IP Law Group LLP

(57) ABSTRACT

An organic light emitting display device includes: a substrate including a first sub-pixel, a second sub-pixel, and a third sub-pixel; a driving thin film transistor and a light emitting diode provided at each of the first to third sub-pixels; an encapsulation substrate configured to cover the driving thin film transistor and the light-emitting diode; and a touch sensor disposed on the encapsulation substrate, wherein the touch sensor includes: a lower electrode disposed on the encapsulation substrate; a first color control layer disposed on the lower electrode to correspond to the first sub-pixel; a second color control layer disposed on the lower electrode to correspond to the second sub-pixel; a third color control layer disposed on the lower electrode to correspond to the third sub-pixel; and an upper electrode disposed on the first to third color control layers, wherein the first to third color control layers have different thicknesses.

10 Claims, 5 Drawing Sheets

ORGANIC LIGHT EMITTING DISPLAY DEVICE INCLUDING TOUCH SENSOR

CROSS-REFERENCE TO RELATED APPLICATIONS

The present application claims the priority benefit of Korean Patent Application No. 10-2017-0177024, filed on Dec. 21, 2017, which is hereby incorporated by reference in its entirety for all purposes as if fully set forth herein.

BACKGROUND

Technical Field

The present disclosure relates to an organic light emitting display device (OLED) including a touch sensor, and more particularly, to an OLED including a touch sensor and being capable of implementing full color without a color filter.

Description of the Related Art

Recently, as society has entered a full-fledged information age, display fields have rapidly advanced as the interest in information displays for processing and displaying a mass of information has increased and the demand for using portable information media has increased, and various lightweight and thin flat panel display devices have been developed and have been getting attention in response to such advance.

Specific examples of the flat panel display devices include liquid crystal display (LCD) devices, plasma display panel (PDP) devices, field emission display (FED) devices, electroluminescent display (ELD) devices, and organic light emitting display devices (OLEDs) which have different sources for light emission, and these flat panel display devices are excellent in performance of reducing thickness, weight, and power consumption to rapidly replace existing cathode ray tubes (CRTs).

Among the above-described flat panel display devices, the OLED is a self-luminous display device and thus the OLED may be made to be lightweight and thin because it does not require a backlight used in the LCD device which is a non-self-luminous display device.

Further, as compared to the LCD device, there are advantages in that the OLED has an excellent view angle and an excellent contrast ratio, is advantageous in terms of power consumption, is capable of being driven by a low direct current (DC) voltage, has a quick response speed, is resistant to external impacts because internal components are solid, and has a broad use temperature range.

Particularly, since the OLED is manufactured through a simplified process, there is an advantage in that production cost may be significantly reduced in comparison to the LCD device.

Meanwhile, in recent years, the demand for a touch panel-attached OLED increases, wherein the touch panel-attached OLED is configured by attaching, to the OLED, a touch panel through which information may be input when an icon or a keyboard displayed on a display screen is selected using a human hand or a separate touch means without a separate input device.

FIGS. 1A and 1B are diagrams describing a principle of a touch panel.

As shown in FIG. 1A, a touch panel 10 is configured such that a dielectric layer 15 is interposed between a first substrate 1 on which a first touch electrode 13 is disposed and a second substrate 2 on which a second touch electrode 17 is disposed, and the first and second touch electrodes 13 and 17 overlap each other with the dielectric layer 15 interposed therebetween to constitute a capacitor for forming mutual capacitance.

In this case, as shown in FIG. 1B, when a predetermined input means such as a finger or a pen (not shown) comes into contact with one point of the touch panel 10, mutual capacitance between the first touch electrode 13 and the second touch electrode 17 may be varied, and thus coordinates of the contact position may be found.

The touch panel 10 is generally attached to an outer surface of the OLED, and in this case, a separate adhesive layer (not shown) for attaching the touch panel 10 is required, and a process for attaching the touch panel 10 is required so that a process time and process costs are increased.

Further, since a thickness of the OLED is also increased as the touch panel 10 is attached, it is difficult to implement a lightweight and thin OLED which have recently been required.

BRIEF SUMMARY

Accordingly, the present disclosure is directed to an organic light emitting display device (OLED) that substantially obviates one or more of the problems due to limitations and disadvantages of the related art.

An advantage of the present disclosure is to provide an OLED including a lightweight and thin touch sensor. Further, an advantage of the present disclosure is to provide an OLED capable of having an advantageous structure for large-area application by minimizing occurrence of an error by patterning an organic light emitting layer at each of sub-regions and capable of implementing full color without a separate color filter.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present disclosure, as embodied and broadly described herein, an organic light emitting display device includes: a substrate including a first sub-pixel, a second sub-pixel, and a third sub-pixel; a driving thin film transistor and a light emitting diode provided at each of the first to third sub-pixels; an encapsulation substrate configured to cover the driving thin film transistor and the light-emitting diode; and a touch sensor disposed on the encapsulation substrate, wherein the touch sensor includes: a lower electrode disposed on the encapsulation substrate; a first color control layer disposed on the lower electrode to correspond to the first sub-pixel; a second color control layer disposed on the lower electrode to correspond to the second sub-pixel; a third color control layer disposed on the lower electrode to correspond to the third sub-pixel; and an upper electrode disposed on the first to third color control layers, wherein the first to third color control layers have different thicknesses.

It is to be understood that both the foregoing general description and the following detailed description are explanatory, and are intended to provide further explanation of the embodiments as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure. In the drawings.

DETAILED DESCRIPTION

Hereinafter, embodiments of the present disclosure will be described in detail with reference to the accompanying drawings.

Figure 2:
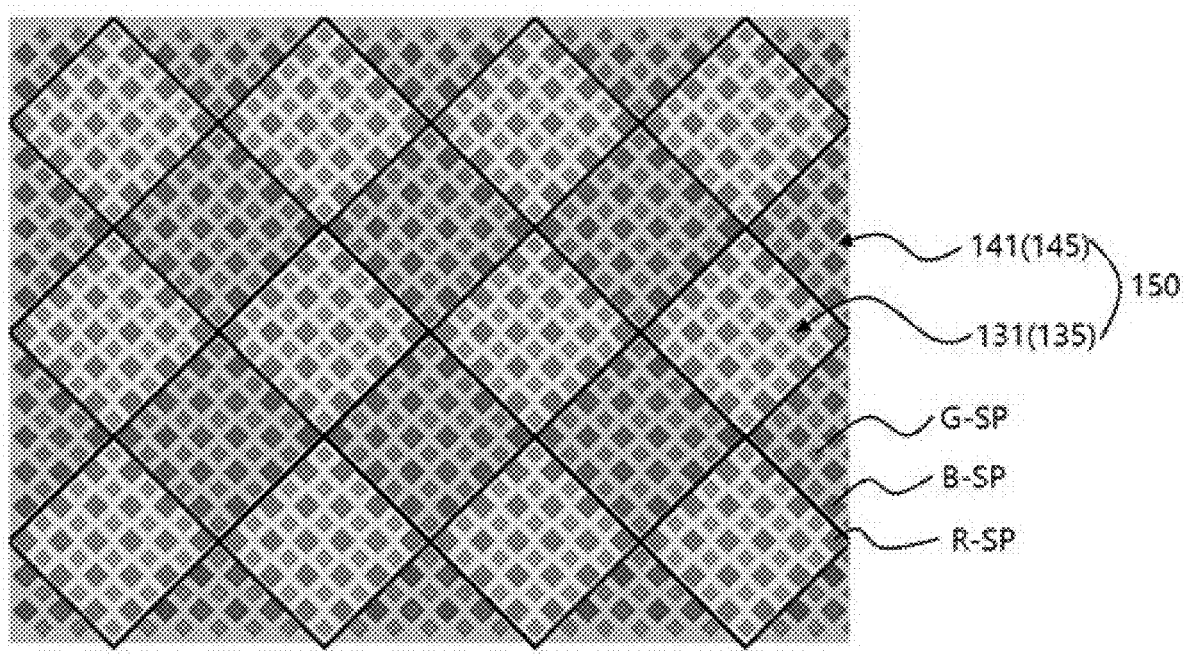
FIG. 2 is a plan view schematically illustrating a plurality of sub-pixels and a touch sensor of an organic light emitting display device (OLED) according to an embodiment of the present disclosure.

FIG. 2 is a plan view schematically illustrating a plurality of sub-pixels and a touch sensor of an organic light emitting display device (OLED) according to an embodiment of the present disclosure.

For convenience of description, a plurality of sub-pixels R-SP, G-SP, and B-SP provided on a substrate, and a first lower electrode surface 131 and a first upper electrode surface 141 of a lower electrode 135 and an upper electrode 145 of a touch sensor 150 are only shown in FIG. 2.

Figure 4:
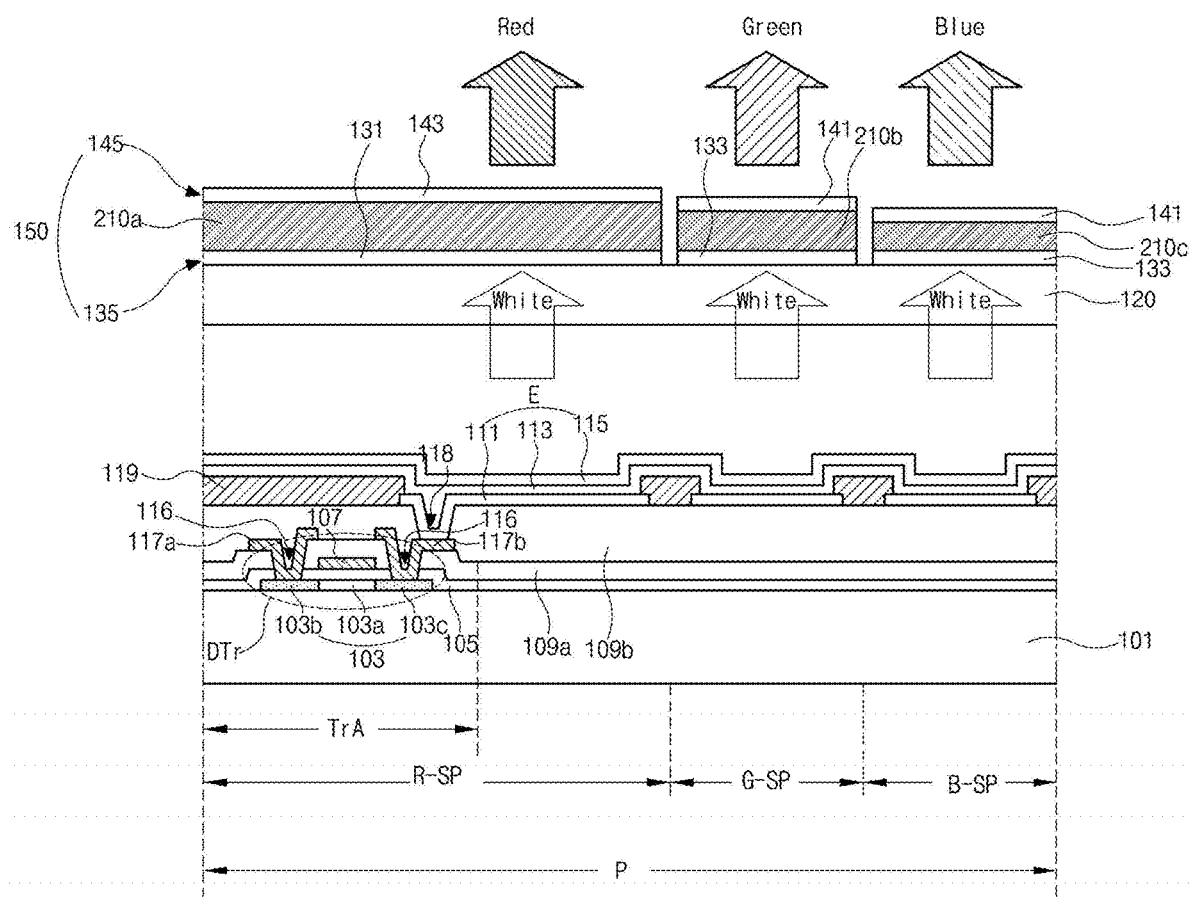
FIG. 4 is a cross-sectional view schematically illustrating a portion of the OLED according to the embodiment of the present disclosure.

As shown in the drawing, the plurality of sub-pixels R-SP, G-SP, and B-SP are disposed on a substrate 101 (see FIG. 4) in the form of a matrix, and a red (R) sub-pixel R-SP, a green (G) sub-pixel G-SP, and a blue (B) sub-pixel B-SP constitute a single unit pixel P (see FIG. 4).

The touch sensor 150 including the first lower electrode surface 131 and the first upper electrode surface 141 is disposed above the plurality of sub-pixels R-SP, G-SP, and B-SP. The first lower electrode surface 131 and the first upper electrode surface 141 are used for a mutual capacitance method. The first lower electrode surface 131 may be referred to as a sensing electrode or an Rx electrode to which a sensing signal generated by a driving pulse is induced, while the first upper electrode surface 141 may be referred to as a driving electrode or a Tx electrode to which the driving pulse is input.

The first lower electrode surface 131 and the first upper electrode surface 141 extend in different directions. The first lower electrode surface 131 extends in a first direction Y (see FIG. 3A), while the first upper electrode surface 141 extends in a second direction X (see FIG. 3B) perpendicular to the first direction Y (see FIG. 3A).

Thus, a plurality of first lower electrode surfaces 131 disposed in the first direction Y (see FIG. 3A) and a plurality of first upper electrode surfaces 141 disposed in the second direction X (see FIG. 3B) calculate coordinates of an X-axis and a Y-axis when being brought into contact with an input device such as a finger or a touch pen, thereby sensing a touch position.

The touch sensor 150 including the first lower electrode surface 131 and the first upper electrode surface 141 according to the embodiment of the present disclosure is disposed on an encapsulation substrate 120 (see FIG. 3A) encapsulating the substrate 101 (see FIG. 4) having a driving thin film transistor DTr (see FIG. 4) and a light-emitting diode (LED) E (see FIG. 4) of the OLED. In this case, the OLED may implement R, G, and B colors through the lower and upper electrodes 135 and 145 including the first lower electrode surface 131 and the first upper electrode surface 141.

That is, in the OLED according to the embodiment of the present disclosure, the touch sensor 150 also serves as a color filter.

Figure 1A:
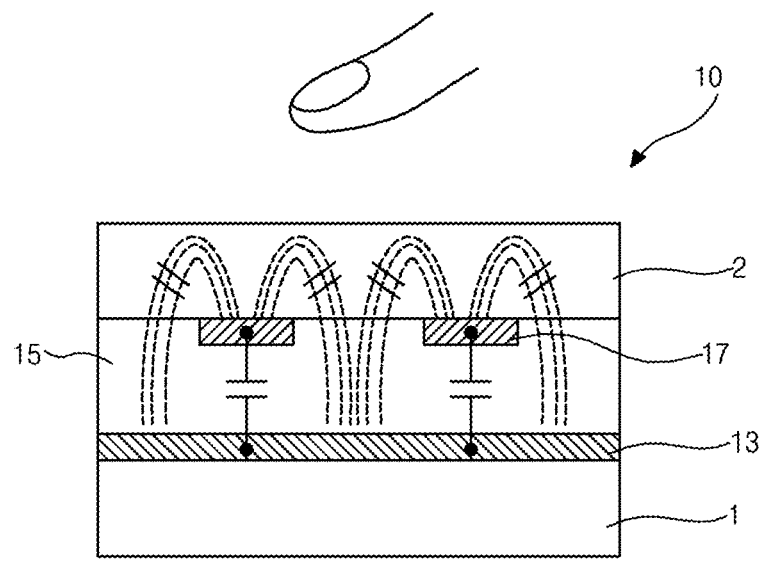
FIGS. 1A and 1B are diagrams for describing a principle of a touch panel.
Figure 1B:
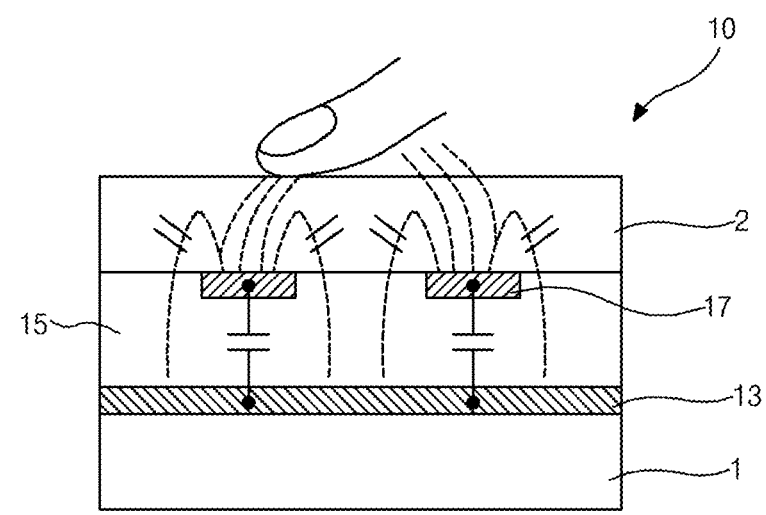

Therefore, the OLED according to the embodiment of the present disclosure does not need to separately have the touch panel 10 of FIG. 1 so that it is possible to provide a lightweight and thin OLED.

Further, occurrence of an error caused by patterning an organic light emitting layer 113 (see FIG. 4) at each of the sub-pixels R-SP, G-SP, and B-SP is minimized such that it is provided an OLED capable of implementing full color without a color filter while having an advantageous structure for large-area application.

Figure 3A:
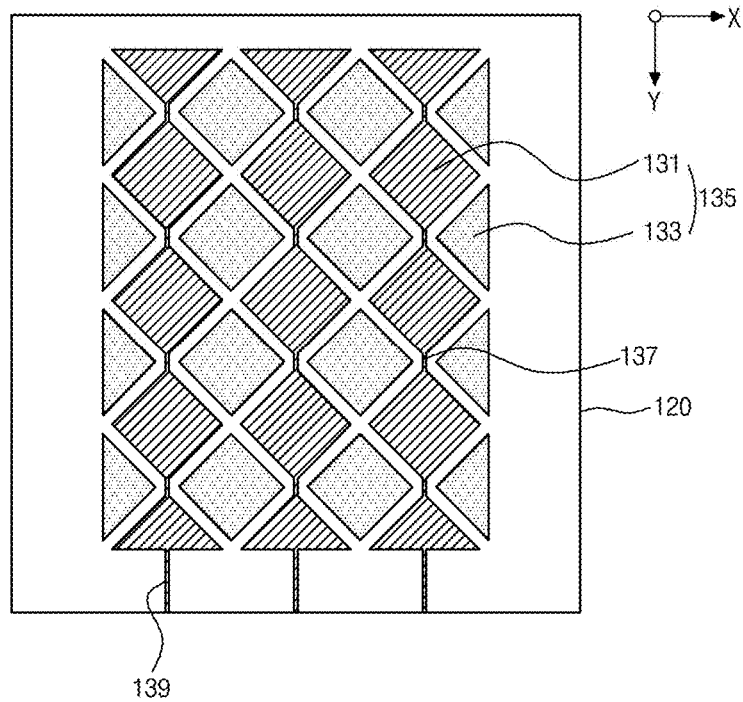
FIGS. 3A and 3B are plan views schematically illustrating a touch sensor according to an embodiment of the present disclosure.
Figure 3B:
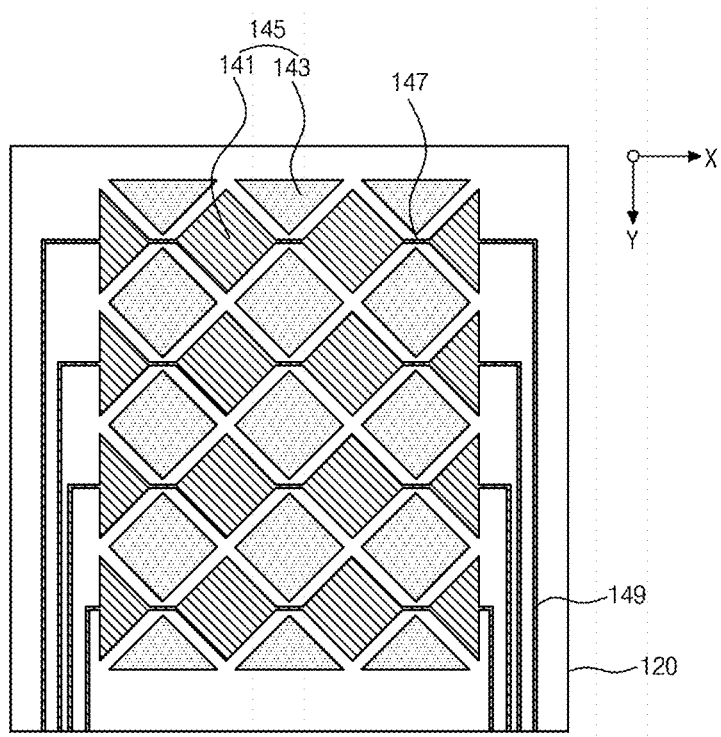

FIGS. 3A and 3B are plan views schematically illustrating a touch sensor according to an embodiment of the present disclosure. FIG. 3A schematically illustrates a lower electrode, and FIG. 3B schematically illustrates an upper electrode.

First, as shown in FIG. 3A, a plurality of first lower electrode surfaces 131 are provided on the encapsulation substrate 120 to be disposed and spaced apart in parallel to the first direction Y. The plurality of first lower electrode surfaces 131 are disposed and spaced apart in parallel to the second direction X perpendicular to the first direction Y.

Further, a plurality of second lower electrode surfaces 133 are disposed in the spaced regions between the plurality of first lower electrode surfaces 131. The plurality of first lower electrode surfaces 131 and the second lower electrode surfaces 133 constitute the lower electrode 135.

As shown in FIG. 3B, a plurality of first upper electrode surfaces 141 are provided above the lower electrode 135 with color control layers 210a, 210b, and 210c (see FIG. 4) interposed therebetween to be disposed and spaced apart in parallel to the second direction X. The plurality of first upper electrode surfaces 141 are also disposed and spaced apart in parallel to the first direction Y. Further, a plurality of second upper electrode surfaces 143 are disposed in the spaced regions between the plurality of first upper electrode surfaces 141.

The plurality of first upper electrode surfaces 141 and the plurality of second upper electrode surfaces 143 constitute the upper electrode 145.

Here, the plurality of first lower electrode surfaces 131 and the plurality of first upper electrode surfaces 141 sense a variance in capacitance caused by the presence or absence of a touch input by a user, e.g., a touch sensing signal. The plurality of first lower electrode surfaces 131 are electrically connected via first connectors 137, while the plurality of first upper electrode surfaces 141 are also electrically connected via second connectors 147.

Accordingly, a first connecting line 139 is connected to the plurality of first lower electrode surfaces 131 connected via the first connectors 137 in the first direction Y, and a signal is applied through the first connecting line 139. Further, a second connecting line 149 is connected to the plurality of first upper electrode surfaces 141 connected via the second connectors 147 in the second direction X, and a signal is applied through the second connecting line 149.

At this point, the first connectors 137 are formed in the first direction Y which is the arrangement direction of the plurality of first lower electrode surfaces 131, and the second connectors 147 are formed in the second direction X which is the arrangement direction of the plurality of first upper electrode surfaces 141.

Meanwhile, the plurality of second lower electrode surfaces 133 of the lower electrode 135 are electrically separated from the plurality of first lower electrode surfaces 131, and the plurality of second upper electrode surfaces 143 of the upper electrode 145 are also electrically separated from the plurality of first upper electrode surfaces 141. Consequently, the plurality of second lower electrode surfaces 133 and the plurality of second upper electrode surfaces 143 are respectively electrically floated from the plurality of first lower electrode surfaces 131 and the plurality of first upper electrode surfaces 141.

In this case, the plurality of second lower electrode surfaces 133 and the plurality of second upper electrode surfaces 143 may be electrically grounded.

The plurality of second lower electrode surfaces 133 and the plurality of second upper electrode surfaces 143 do not substantially contribute to sensing the touch sensing signal, and when the touch sensor 150 of FIG. 2 serves as a color filter, the plurality of second lower electrode surfaces 133 and the plurality of second upper electrode surfaces 143 allow the lower electrode 135 and the upper electrode 145 to be positioned to correspond to all the R, B, and G sub-pixels R-SP, B-SP, and G-SP of FIG. 2. Such a structure will be described in more detail below.

As described above, when an electrostatic object comes into contact with the touch sensor 150 of FIG. 2, the touch sensor 150 of FIG. 2 senses a variance in mutual capacitance between the first lower electrode surface 131 and the first upper electrode surface 141 at a contact point, thereby sensing the touch sensing signal.

Meanwhile, even when a thickness of the touch sensor 150 of FIG. 2 is formed to be small, a retransmission phenomenon does not occur in the touch sensor 150 of FIG. 2 by means of the second lower electrode surface 133 and the second upper electrode surface 143.

That is, the second lower electrode surface 133 and the second upper electrode surface 143 of the present disclosure serve as important components for implementing a color filter, and at the same time, the second lower electrode surface 133 and the second upper electrode surface 143 serve as components capable of preventing occurrence of the retransmission phenomenon even in the touch sensor 150 of FIG. 2.

To describe in more detail, when the thickness of the touch sensor 150 of FIG. 2 becomes smaller, a distance between an electrostatic object (e.g., a finger or a touch pen) and the first lower electrode surface 131 and the first upper electrode surface 141 may be reduced. In this case, the electrostatic object may generate parasitic capacitance at other points except for a contact point, and the parasitic capacitance may cause a retransmission phenomenon varying the mutual capacitance at the other points except for the contact point.

Consequently, there may occur problems in that touch signals may be generated at the other points except for the contact point, or the touch signals generated at the other points are offset against the touch signal of the contact point such that the touch is not recognized.

Here, the retransmission phenomenon may be solved by increasing the distance between the electrostatic object and the first lower electrode surface 131 and the first upper electrode surface 141, but there occurs a problem in that the thickness of the touch sensor 150 of FIG. 2 should be increased so as to increase the distance between the electrostatic object and the first lower electrode surface 131 and the first upper electrode surface 141.

Contrarily, in the touch sensor 150 of FIG. 2 according to the present disclosure, the second lower electrode surface 133 disposed adjacent to the first lower electrode surface 131 of the lower electrode 135 and the second upper electrode surface 143 disposed adjacent to the first upper electrode surface 141 of the upper electrode 145 serve to reduce the parasitic capacitance between the electrostatic object and the first lower electrode surface 131 and between the electrostatic object and the first upper electrode surface 141.

Capacitance is inversely proportional to a distance between two conductors facing each other and is proportional to an area of a conductor. Thus, the second lower electrode surface 133 of the lower electrode 135 and the second upper electrode surface 143 of the upper electrode 145 are electrically separated from a touch sensing part formed by the first lower electrode surface 131 and the first upper electrode surface 141 such that an area of an effective sensing electrode surface of each of the upper and lower electrodes 145 and 135 is reduced.

Consequently, each of the parasitic capacitance between the electrostatic object and the first lower electrode surface 131 and the parasitic capacitance between the electrostatic object and the first upper electrode surface 141 may be reduced, and the retransmission phenomenon may not easily occur.

Although the first upper electrode surface 141 and the second upper electrode surface 143 of the upper electrode 145 and the first lower electrode surface 131 and the second lower electrode surface 133 of the lower electrode 135 are shown in rhombic shapes in the drawings, the first and second upper and lower electrode surfaces 141, 143, 131, and 133 are not limited thereto and may be formed in various shapes such as a triangle, a square, a rectangle, and a circle or the like. Further, the number and size of the upper and lower electrodes 145 and 135 may be varied according to the resolution and the size of the OLED.

That is, the touch sensor 150 of FIG. 2 including the upper and lower electrodes 145 and 135 according to the embodiment of the present disclosure is disposed on the encapsulation substrate 120 of the OLED, thereby being capable of implementing a function of the touch sensor 150 of FIG. 2 and, simultaneously, a function of a color filter.

By using the touch sensor 150 of FIG. 2 according to the embodiment of the present disclosure, the separate substrates 1 and 2 of FIG. 1 constituting the touch panel 10 of FIG. 1 may be omitted, and a separate adhesive layer for attaching the touch panel 10 of FIG. 1 to the OLED may also be omitted such that a lightweight and thin OLED may be provided.

Further, a process of attaching the touch panel 10 of FIG. 1 may be omitted such that a process time and process costs can be reduced and process efficiency can also be improved.

Furthermore, occurrence of an error caused by patterning the organic light emitting layer 113 (see FIG. 4) at each of the sub-pixels R-SP, G-SP, and B-SP is minimized such that it is provided an OLED capable of implementing full color without a color filter while having an advantageous structure for large-area application.

Such a structure will be described in more detail with reference to FIG. 4

Figure 5:
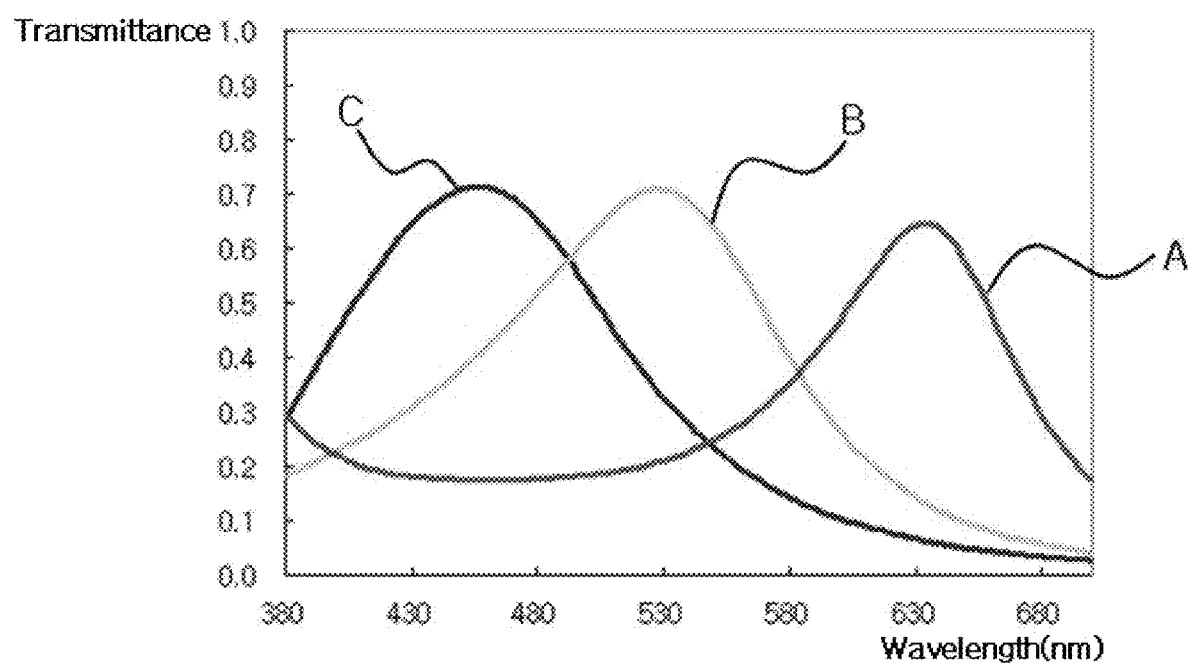
FIG. 5 is a graph showing an experimental result of measuring a wavelength of light according to a thickness of a color control layer according to the embodiment of the present disclosure.

FIG. 4 is a cross-sectional view schematically illustrating a portion of the OLED according to the embodiment of the present disclosure, and FIG. 5 is a graph showing an experimental result of measuring a wavelength of light according to a thickness of a color control layer.

For convenience of description, a single unit pixel P configured with one R sub-pixel R-SP, one G sub-pixel G-SP, and one B sub-pixel B-SP are shown in FIG. 4. In order to definitely illustrate a configuration of the touch sensor 150, FIG. 4 schematically illustrates the single unit pixel P corresponding to a region between the first lower electrode surface 131 and the second lower electrode surface 133, and to a region between the first upper electrode surface 141 and the second upper electrode surface 143.

Further, the driving thin film transistor DTr is disposed at each of the R, G, and B sub-pixels R-SP, G-SP, and B-SP, but for simplicity of the drawing, the driving thin film transistor DTr is shown in only the R sub-pixel R-SP.

The OLED including the touch sensor 150 according to the embodiment of the present disclosure is classified into a top emission type OLED and a bottom emission type OLED according to a transmission direction of emitted light, and an example of a top emission type OLED according to the present disclosure will be described below.

As shown in the drawing, the OLED according to the embodiment of the present disclosure is configured with the array substrate 101 on which the driving thin film transistor DTr and the LED E are formed, and the encapsulation substrate 120 facing the array substrate 101. The array substrate 101 and the encapsulation substrate 120 are bonded to each other to constitute the OLED.

At this point, the touch sensor 150 is provided on the encapsulation substrate 120.

To describe in more detail, a gate line (not shown), a data line (not shown), and a power line (not shown) are disposed on the array substrate 101 to define each of the sub-pixels.

The plurality of sub-pixels are configured with R sub-pixels R-SP, G sub-pixels G-SP, and B sub-pixels B-SP, and a R sub-pixel R-SP, a G sub-pixel G-SP, and a B sub-pixel B-SP constitute a single unit pixel P.

Here, a semiconductor layer 103 is disposed on a switching area TrA of each of the R, G, and B sub-pixels R-SP, G-SP, and B-SP on the array substrate 101. The semiconductor layer 103 is made of silicon, and a central portion of the semiconductor layer 103 is configured with an active region 103a constituting a channel, and source and drain regions 103b and 103c doped with impurities at a high concentration on both lateral sides of the active region 103a.

A gate insulating film 105 is disposed on the semiconductor layer 103.

A gate electrode 107 corresponding to the active region 103a of the semiconductor layer 103 and a gate line (not shown) extending in one direction are provided on the gate insulating film 105.

Further, an interlayer insulating film 109a is disposed on the gate electrode 107 and the gate line (not shown). At this point, first and second semiconductor layer contact holes 116 are provided at the interlayer insulating film 109a and the gate insulating film 105 below the interlayer insulating film 109a to expose the source and drain regions 103b and 103c disposed at both of the lateral sides of the active region 103a.

Next, source and drain electrodes 117a and 117b spaced apart from each other are provided on the interlayer insulating film 109a including the first and second semiconductor layer contact holes 116 to be brought into contact with the source and drain regions 103b and 103c exposed through the first and second semiconductor layer contact holes 116.

A protective layer 109b having a drain contact hole 118 configured to expose the drain electrode 117b of the driving thin film transistor DTr is disposed on the source and drain electrodes 117a and 117b and the interlayer insulating film 109a exposed between the source and drain electrodes 117a and 117b.

At this point, the source and drain electrodes 117a and 117b, the semiconductor layer 103 including the source and drain regions 103b and 303c in contact with the source and drain electrodes 117a and 117b, and the gate insulating film 105 and the gate electrode 107 disposed on the semiconductor layer 103 constitute the driving thin film transistor DTr.

Although not shown in the drawing, a switching thin film transistor STr is connected to the driving thin film transistor DTr, and the switching thin film transistor STr and the driving thin film transistor DTr are formed to have the same structure.

Further, the switching thin film transistor STr and the driving thin film transistor DTr are shown as an example of a top gate type in which the semiconductor layer 103 is formed of a polysilicon semiconductor layer or an oxide semiconductor layer, and as a modified example, the switching thin film transistor STr and the driving thin film transistor DTr may be provided in a bottom gate type made of pure amorphous silicon and amorphous silicon doped with impurities.

In this case, when the semiconductor layer 103 is formed of an oxide semiconductor layer, a light block layer (not shown) may further be disposed below the semiconductor layer 103, and a buffer layer (not shown) may be disposed between the light block layer and the semiconductor layer 103.

A first electrode 111 is disposed on the protective layer 109b, wherein the first electrode 111 is connected to the drain electrode 117b of the driving thin film transistor DTr and is made of a material having, e.g., a relatively high work function value, to constitute an anode of the LED E.

The first electrode 111 may be formed of a metal oxide such as indium tin oxide (ITO), indium zinc oxide (IZO), or the like.

The first electrode 111 is disposed at each of the sub-pixels R-SP, G-SP, and B-SP, and a bank 119 is disposed between the first electrodes 111 disposed at the sub-pixels R-SP, G-SP, and B-SP.

That is, the first electrodes 111 are configured to be separated in the respective sub-pixels R-SP, G-SP, and B-SP by serving the banks 119 as boundaries of the respective sub-pixels R-SP, G-SP, and B-SP.

Further, the organic light emitting layer 113 for emitting white light is disposed on the first electrode 111 including the bank 119, and a second electrode 115 for constituting a cathode is disposed on an entire surface of the organic light emitting layer 113.

Here, since the organic light emitting layer 113 emits one type of light which is white light, the organic light emitting layer 113 is formed at an entire surface of the unit pixel P without being patterned at each of the sub-pixels R-SP, G-SP, and B-SP.

The organic light emitting layer 113 for emitting white light may be formed of a single layer made of an emitting material, and alternatively, in order to increase light emitting efficiency, the organic light emitting layer 113 may be formed of a multilayer including a hole injection layer, a hole transport layer, an emitting material layer, an electron transport layer, and an electron injection layer.

In this case, the embodiment of the present disclosure may be characterized in that the hole injection layer, the hole transport layer, the electron transport layer, and the electron injection layer, which are formed to improve the light emitting efficiency of the organic light emitting layer 113, are also formed on the entire surface of the unit pixel P without being patterned at each of the sub-pixels R-SP, G-SP, and B-SP.

Therefore, owing to the above-described structure of the organic light emitting layer 113, as compared to a prior art organic light emitting layer formed by being patterned at each of the sub-pixels R-SP, G-SP, and B-SP to emit R, G, or B light, the OLED according to the embodiment of the present disclosure has an advantage in that a patterning process using a shadow mask is reduced by one to five times, thereby minimizing a patterning error and, simultaneously, a defective rate. In one embodiment, the organic light emitting layer 113 may be formed in a single patterning process during the manufacturing process thereby allowing the organic light emitting layer 113 to be formed in a single continuous layer. In this embodiment, the organic light emitting layer 113 need not be patterned separately using a different process for each R, G, B sub-pixels which simplifies the overall process and completes the deposition of the organic light emitting layer 113 in a single procedure.

The second electrode 115 may be made of a material having a relatively low work function value. In this case, the second electrode 115 may be formed of a single layer which is made of an alloy in which a first metal such as Ag or the like which is a metal material having a low work function, and a second metal such as Mg or the like are mixed with a predetermined ratio, or a multi-layer using the first metal and the second metal.

In the OLED, when a predetermined voltage is applied to the first electrode 111 and the second electrode 115 according to a selected signal, holes injected from the first electrode 111 and electrons provided from the second electrode 115 are transported to the organic light emitting layer 113 to form excitons, and when the excitons are transitioned from an excited state to a ground state, light is generated and emitted in the form of visible light.

Here, the OLED according to the embodiment of the present disclosure may be a top emission type OLED in which light emitted from the organic light emitting layer 113 is output to the outside through the second electrode 115. In this case, the first electrode 111 may further include a reflective layer (not shown) made of an opaque conductive material. For example, the reflective layer may be formed of an aluminum-palladium-copper (APC) alloy. The second electrode 115 may have a triple-layered structure of ITO/APC/ITO.

Further, the second electrode 115 may be formed of a semi-transmissive conductive material such as magnesium (Mg), silver (Ag), or an alloy of Mg and Ag. When the second electrode 115 is formed of a semi-transmissive conductive material, light emitting efficiency may be increased by a micro cavity.

A capping layer (not shown) may be formed on the second electrode 115.

Further, the encapsulation substrate 120 having a thin film shape is formed on the driving thin film transistor DTr and the LED E such that the OLED is encapsulated through the encapsulation substrate 120.

In order to prevent external oxygen and moisture from infiltrating into the OLED, at least two inorganic protective films are stacked on the encapsulation substrate 120. In this case, an organic protective film is preferably interposed between two inorganic protective films so as to complement impact resistance of the two inorganic protective films.

In such a structure in which the organic protective film and the inorganic protective film are alternately repeatedly stacked, since moisture and oxygen is required to be prevented from infiltrating through a lateral surface of the organic protective film, a structure in which the inorganic protective film completely encloses the organic protective film is preferred.

Therefore, moisture and oxygen can be prevented from infiltrating into the OLED from the outside.

Here, in the OLED according to the embodiment of the present disclosure, the touch sensor 150 is disposed on the encapsulation substrate 120. In the touch sensor 150, the lower electrode 135 and the upper electrode 145 are disposed and spaced apart to face each other at a predetermined interval, and the color control layers 210a, 210b, and 210c having different thicknesses in the sub-pixels R-SP, G-SP, and B-SP are provided between the lower electrode 135 and the upper electrode 145.

Each of the color control layers 210a, 210b, and 210c may be formed of an organic material, nitride, or oxide. The color control layers 210a, 210b, and 210c are formed of a transparent material so as to transmit light emitted from the organic light emitting layer 113. For example, when the color control layers 210a, 210b, and 210c are formed of an organic material, the color control layers 210a, 210b, and 210c may be formed of an organic insulating material such as polyimide, photo acryl, or benzocyclobutene (BCB). Alternatively, when the color control layers 210a, 210b and 210c are made of a nitride, the color control layers 210a, 210b, and 210c may be formed of silicon nitride (SiNx) or the like.

Alternatively, when the color control layers 210a, 210b, and 210c are made of an oxide, the color control layers 210a, 210b, and 210c may be made of molybdenum oxide ($MoO_3$), silicon oxide ($SiO_2$), IZO, ITO, indium tin zinc oxide (ITZO), or the like.

Here, in the lower electrode 135 disposed on the encapsulation substrate 120, a plurality of first lower electrode surfaces 131 are disposed and spaced apart at regular intervals, and a plurality of second lower electrode surfaces 133 are located between the spaced regions of the plurality of first lower electrode surfaces 131.

Further, in the upper electrode 145 disposed above the lower electrode 135 with the color control layers 210a, 210b, and 210c interposed therebetween, a plurality of first upper electrode surfaces 141 are disposed and spaced apart at regular intervals, and a plurality of second upper electrode surfaces 143 are disposed between the spaced regions of the plurality of first upper electrode surfaces 141.

Each of the lower electrode 135 and the upper electrode 145 may be formed of a metal material such as Ag, titanium (Ti), aluminum (Al), gold (Au), molybdenum (Mo), or an alloy of Ag and Mg with a thickness of several hundred Å or less. The lower electrode 135 and the upper electrode 145 are formed to have the same thickness. That is, when the lower electrode 135 made of the first and second lower electrode surfaces 131 and 133 and the upper electrode 145 made of the first and second upper electrode surfaces 141 and 143 have substantially the same thickness, transmittance for light having a specific wavelength band may be increased.

Therefore, visibility and transmittance of light emitted from the plurality of sub-pixels R-SP, G-SP, and B-SP of the OLED are not significantly degraded by the lower electrode 135 and the upper electrode 145.

Here, since the first and second lower electrode surfaces 131 and 133 and the first and second upper electrode surfaces 141 and 143 of the touch sensor 150 are formed to be larger than one sub-pixel R-SP, G-SP or B-SP, the first lower electrode surface 131 and the second upper electrode surface 143, which are disposed on the R sub-pixel R-SP, and the second lower electrode surface 133 and the first upper electrode surface 141, which are disposed on the G sub-pixel G-SP and the B sub-pixel B-SP, are only shown in FIG. 4 which illustrates only the single unit pixel P made of the R sub-pixel R-SP, the G sub-pixel G-SP, and the B sub-pixel B-SP.

As described above, the color control layers 210a, 210b, and 210c are respectively disposed at the sub-pixels R-SP, G-SP, and B-SP between the lower electrode 135 made of the first and second lower electrode surfaces 131 and 133, and the upper electrode 145 made of the first and second upper electrode surfaces 141 and 143 of the touch sensor 150 such that light transmitted through the lower electrode 135, the color control layers 210a, 210b, and 210c, and the upper electrode 145 has a specific color wavelength, thereby being capable of implementing a color of a desired wavelength according to a thickness of each of the color control layers 210a, 210b, and 210c.

That is, the OLED according to the embodiment of the present disclosure may emit R, G, and B light from the sub-pixels R-SP, G-SP, and B-SP by respectively disposing the thickness-controlled color control layers 210a, 210b, and 210c on the lower electrode 135 at the sub-pixels R-SP, G-SP, and B-SP.

FIG. 5 is a graph showing experimental results of measuring wavelengths of light according to thicknesses of the color control layers 210a, 210b and 210c. An x-axis of the graph represents a wavelength band of transmitted light and a y-axis thereof represents transmittance of incident light.

Here, light transmitted through the color control layer 210a, which has a thickness of 1200 Å, is denoted as A, light transmitted through the color control layer 210b, which has a thickness of 900 Å, is denoted as B, and light transmitted through the color control layer 210c, which has a thickness of 700 Å, is denoted as C.

Referring to FIG. 5, it can be seen that, when the thickness of the color control layer 210a is 1200 Å, the light A has a peak value at a wavelength of 630 nm exhibiting a red color, and when the thickness of the color control layer 210b is 900 Å, the light B has a peak value at a wavelength of 530 nm exhibiting a green color, and when the thickness of the color control layer 210c is 700 Å, the light C has a peak value at a wavelength of 450 nm exhibiting a green color. According to such results, the OLED according to the embodiment of the present disclosure converts white light emitted from the organic light emitting layer 113 into red, green, and blue light while the white light is transmitted through the touch sensor 150 by respectively interposing the thickness-controlled color control layers 210a, 210b, and 210c between the lower electrode 135 and the upper electrode 145 of the touch sensor 150 at the sub-pixels R-SP, G-SP, and B-SP.

That is, the color control layer 210a having a first thickness is disposed between the second upper and first lower electrode surfaces 143 and 131 corresponding to the R sub-pixel R-SP, and the color control layer 210b having a second thickness that is narrower than the first thickness is disposed between the first upper and second lower electrode surfaces 141 and 133 corresponding to the G sub-pixel G-SP. Further, the color control layer 210c having a third thickness that is smaller than the second thickness is disposed between the first upper and second lower electrode surfaces 141 and 133 corresponding to the B sub-pixel B-SP.

Accordingly, while the white light is transmitted through the touch sensor 150, the white light emitted from the organic light emitting layer 113 is converted into red light at the R sub-pixel R-SP, into green light at the G sub-pixel G-SP, and into blue light at the B sub-pixel B-SP. Therefore, the OLED according to the embodiment of the present disclosure may implement full color without a separate color filter.

Further, the lower electrode 135, the upper electrode 145, and the color control layers 210a, 210b, and 210c interposed between the lower electrode 135 and the upper electrode 145 maximize transmittance for light having a specific wavelength through an effect of the micro cavity.

Here, the effect of the micro cavity is that light reflected between mirrors is destructively or constructively interfered so that only light having a predetermined wavelength is maintained and light having other wavelengths is cancelled to increase or decrease intensity of light having a specific wavelength.

Accordingly, the white light incident on the touch sensor 150 is repeatedly reflected between the lower electrode 135 and the upper electrode 145 such that a constructive interference is generated with respect to a specific wavelength. Thus, the touch sensor 150 including the lower electrode 135, the color control layers 210a, 210b, and 210c, and the upper electrode 145 may maximize transmittance with respect to light having a specific wavelength.

In order to implement such an effect of the micro cavity, it is required to constitute a depth or a length of the micro cavity between the lower electrode 135 and the upper electrode 145 at each of the sub-pixels R-SP, G-SP, and B-SP, or a thickness of the micro cavity of each of the color control layers 210a, 210b, and 210c such that a resonance wavelength corresponding a desired color peak wavelength is produced.

$$n^*d=(2m-1)\lambda(m=0,1,2,\ldots)\qquad\text{[Equation 1]}$$

Here, n is a refractive index of each of the color control layers 210a, 210b, and 210c, d is a length between the lower electrode 135 and the upper electrode 145 at each of the sub-pixels R-SP, G-SP, and B-SP or a thickness of each of the color control layers 210a, 210b, and 210c, m is a constant, and λ is a desired central wavelength.

Light having a wavelength band corresponding to a set depth of the micro cavity is amplified by a constructive interference in each of the color control layers 210a, 210b, and 210c and is transmitted to the outside. On the other hand, light of a wavelength band not corresponding to the depth of the micro cavity is cancelled by a destructive interference in each of the color control layers 210a, 210b, and 210c.

Since wavelength bands of red, green, and blue light are different from each other, depths of the micro cavity are differently set according to a color to be implemented. For example, assuming that the color control layers 210a, 210b and 210c are an organic material and a refractive index of the organic material is 1.5, since a main wavelength band of red light is about 650 nm, a depth of the micro cavity is set to a multiple of about 217 nm from Equation 1. Accordingly, a thickness of the color control layer 210a corresponding to the R sub-pixel R-SP may be set to the multiple of about 217 nm.

Further, since a main wavelength band of green light is about 550 nm, a thickness of the color control layer 210b corresponding to the G sub-pixel G-SP may be set to a multiple of about 183 nm, and since a main wavelength band of blue light is 420 nm, a thickness of the color control layer 210c corresponding to the B sub-pixel B-SP may be set to a multiple of about 140 nm.

That is, the OLED according to the embodiment of the present disclosure may implement the red, green, and blue light through the touch sensor 150 without a separate color filter, thereby implementing full color.

Accordingly, since the organic light emitting layer 113 emitting light of different colors may not be patterned and formed at each of the sub-pixels R-SP, G-SP, and B-SP, occurrence of an error caused by patterning the organic light emitting layer 113 at each of the sub-pixels R-SP, G-SP, and B-SP is minimized such that it is possible to provide the OLED capable of implementing full color without a separate color filter while having a structure advantageous for large-area application.

Meanwhile, while the touch sensor 150 is implemented through the lower electrode 135 and the upper electrode 145, the thicknesses of the color control layers 210a, 210b, and 210c interposed between the lower electrode 135 and the upper electrode 145 are differently formed for each of the sub-pixels R-SP, G-SP, and B-SP such that a mutual capacitance value formed between the lower electrode 135 and the upper electrode 145 may also be formed to have a different value at each of the sub-pixels R-SP, G-SP, and B-SP.

As described above, when the mutual capacitance values are differently formed at each of the sub-pixels R-SP, G-SP, and B-SP, there may occur a problem in that a touch signal of a contact point is not accurately recognized.

To this end, the OLED including the touch sensor 150 according to the embodiment of the present disclosure includes the R, G, and B sub-pixels R-SP, G-SP, and B-SP which are each provided as the same number in the first and second upper and lower electrode surfaces 141, 143, 131, and 133 such that it is possible to prevent variation in a mutual capacitance value according to the thickness of each of the color control layers 210a, 210b, and 210c.

As described above, the OLED according to the embodiment of the present disclosure includes the touch sensor 150, which includes the lower electrode 135 and the upper electrode 145 on the encapsulation substrate 120, and the color control layers 210a, 210b, and 210c interposed between the lower electrode 135 and the upper electrode 145. Thus, the OLED including the touch sensor 150 can be provided, and the separate substrates 1 and 2 of FIG. 1 for constituting the touch panel 10 of FIG. 1 can be omitted, and a separate adhesive layer (not shown) for attaching the touch panel 10 of FIG. 1 to the OLED can be omitted, thereby providing a lightweight and thin OLED.

Further, a process of attaching the touch panel 10 of FIG. 1 may be omitted such that a process time and process costs can be reduced and process efficiency can also be improved.

Furthermore, occurrence of an error caused by patterning the organic light emitting layer 113 at each of the sub-pixels R-SP, G-SP, and B-SP is minimized such that it is provided an OLED capable of implementing full color without a color filter while having an advantageous structure for large-area application.

Meanwhile, in the description of FIG. 4, since different signals are applied to the first lower electrode surface 131 and the first upper electrode surface 141, the first lower electrode surface 131 and the first upper electrode surface 141 may be disposed and spaced apart from each other at a predetermined interval. Consequently, the second lower electrode surface 133, which is disposed coplanar with the first lower electrode surface 131 and is grounded, may also be disposed and spaced apart from the first lower electrode surface 131 at a predetermined interval.

Further, the second upper electrode surface 143 may be disposed and spaced apart from the first upper electrode surface 141 at a predetermined interval. The first upper electrode surface 141 may be grounded. In one embodiment, the second upper electrode surface 143 may be disposed on the same side as the first upper electrode surface 141 and spaced apart from each other. In another embodiment, the second upper electrode surface 143 may be coplanar with the first upper electrode surface 141 and spaced apart from each other.

However, as far as the color control layers 210a, 210b, and 210c, which are disposed between the first and second lower electrode surfaces 131 and 133 and between the first and second upper electrode surfaces 141 and 143, have different thickness at the respective sub-pixels R-SP, G-SP, and B-SP, the color control layers 210a, 210b, and 210c disposed between the first and second lower electrode surfaces 131 and 133 may be connected to the color control layers 210a, 210b, and 210c disposed between the first and second upper electrode surfaces 141 and 143. In the above description, an example in which the touch sensor 150 is driven by a mutual capacitance method has been described, but the present disclosure is not limited thereto, and the touch sensor 150 may be driven by a self-touch sensing method.

As described above, an OLED according to the present disclosure includes a touch sensor having a lower electrode and an upper electrode on an encapsulation substrate, and a color control layer interposed between the lower electrode and the upper electrode such that the OLED including the touch sensor can be provided, a separate substrate for constituting a touch panel can be omitted, and a separate adhesive layer for attaching the touch panel to the OLED can be omitted. Therefore, there is an effect of being capable of providing a lightweight and thin OLED.

Further, a process of attaching the touch panel can be omitted such that there is an effect of being capable of reducing a process time and process costs and also improving process efficiency.

Furthermore, occurrence of an error caused by patterning an organic light emitting layer at each of sub-regions is minimized such that there is an effect of being capable of having an advantageous structure for large-area application as well as implementing full color without a separate color filter.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a first sub-pixel, a second sub-pixel, and a third sub-pixel, each of the first to third sub-pixels including a driving thin film transistor and a light emitting diode;
an encapsulation substrate configured to cover the driving thin film transistor and the light-emitting diode of each of the first, second and third sub-pixels; and
a touch sensor disposed on the encapsulation substrate, wherein the touch sensor includes:
a first, a second, and a third lower electrode disposed on the encapsulation substrate;
a first color control layer disposed on the first lower electrode to correspond to the first sub-pixel, the first color control layer having a first thickness;
a second color control layer disposed on the second lower electrode to correspond to the second sub-pixel, the second color control layer having a second thickness;
a third color control layer disposed on the third lower electrode to correspond to the third sub-pixel, the third color control layer having a third thickness; and
a first, a second, and a third upper electrode disposed on each of the first, the second, and the third color control layers, respectively,
wherein the first, second and third thickness of the first, second and third color control layers are different from each other.

2. The organic light emitting display device of claim 1, wherein the lower electrode and the upper electrode have a same thickness.

3. The organic light emitting display device of claim 1, wherein a white light is emitted from the light-emitting diode,
wherein the first sub-pixel is a red sub-pixel and the thickness of the first color control layer is configured to convert the white light into red light,
wherein the second sub-pixel is a green sub-pixel and the thickness of the second color control layer is configured to convert the white light into green light, and
wherein the third sub-pixel is a blue sub-pixel and the thickness of the third color control layer is configured to convert the white light into blue light.

4. The organic light emitting display device of claim 3, wherein the first color control layer of the red sub-pixel has a first thickness,
wherein the second color control layer of the green sub-pixel has a second thickness that is smaller than the first thickness, and
wherein the third color control layer of the blue sub-pixel has a third thickness that is smaller than the second thickness.

5. The organic light emitting display device of claim 1, wherein the lower electrodes include a plurality of first lower electrode surfaces and a plurality of second lower electrode surfaces, the plurality of first lower electrode surfaces are disposed in a first direction and electrically connected to each other, the plurality of second lower electrode surfaces are disposed between the plurality of first lower electrode surfaces,
wherein the upper electrodes include a plurality of first upper electrode surfaces and a plurality of second upper electrode surfaces, the plurality of first upper electrode surfaces are disposed in a second direction perpendicular to the first direction and electrically connected to each other, the plurality of second upper electrode surfaces are disposed between the plurality of first upper electrode surfaces,
wherein the plurality of second lower electrode surfaces are electrically separated from the plurality of first lower electrode surfaces, and
wherein the plurality of second upper electrode surfaces are electrically separated from the plurality of first upper electrode surfaces.

6. The organic light emitting display device of claim 5, wherein a first set of the plurality of first lower electrode surfaces are disposed in parallel with an adjacent second set of the plurality of first lower electrode surfaces and spaced apart in the second direction, and the adjacent second set of the plurality of first lower electrode surfaces disposed in the second direction are electrically separated from the first set, and
wherein a first set of the plurality of first upper electrode surfaces are disposed in parallel with an adjacent second set of the plurality of first upper electrode surfaces and spaced apart in the first direction, and the adjacent second set of the plurality of first upper electrode surfaces disposed in the first direction are electrically separated from the first set.

7. The organic light emitting display device of claim 5, wherein the plurality of second lower electrode surfaces and the plurality of second upper electrode surfaces are electrically grounded.

8. The organic light emitting display device of claim 1, wherein the light emitting diode includes a first electrode disposed below each of the first to third sub-pixels, an organic light emitting layer disposed on the first electrode as a single, continuous layer, and a second electrode disposed on the organic light emitting layer.

9. The organic light emitting display device of claim 8, wherein the driving thin film transistor includes a semiconductor layer, a gate insulating film disposed on the semiconductor layer, a gate electrode disposed on the gate insulating film, an interlayer insulating film disposed on the gate electrode, and source and drain electrodes disposed on the interlayer insulating film, and
wherein the first electrode is disposed on a protective layer which is disposed on the source and drain electrodes.

10. A display device, comprising:
a first sub-pixel, a second sub-pixel, and a third sub-pixel, each of the first, the second, and the third sub-pixel including a respective transistor and light emitting source;
a substrate overlying on the transistor and the light emitting source of each of the first, the second, and the third sub-pixel; and
a touch sensor disposed on the substrate, wherein the touch sensor includes:

a plurality of lower electrodes spaced apart from each other, each of the lower electrodes disposed on the substrate;

a plurality of upper electrodes spaced apart from each other, each of the upper electrodes positioned over a corresponding one of the lower electrodes;

a first color control layer located between a first lower electrode of the plurality of lower electrodes and a first upper electrode of the plurality of upper electrodes, the first color control layer emits light corresponding to a color of the first sub-pixel;

a second color control layer located between a second lower electrode of the plurality of lower electrodes and a second upper electrode of the plurality of upper electrodes, the second color control layer emits light corresponding to a color of the second sub-pixel; and a third color control layer located between a third lower electrode of the plurality of lower electrodes and a third upper electrode of the plurality of upper electrodes, the third color control layer emits light corresponding to a color of the third sub-pixel;

wherein the first, second and third color control layers have different thicknesses to emit lights having different wavelengths.

\* \* \* \* \*